US 6,742,166 B2

(12) United States Patent
Foster et al.

(10) Patent No.: US 6,742,166 B2
(45) Date of Patent: May 25, 2004

(54) SYSTEM AND METHOD FOR EVALUATING FUNCTIONAL COVERAGE LINKED TO A VERIFICATION TEST PLAN

(75) Inventors: Harry D. Foster, Plano, TX (US); Robert John Porter, Celina, TX (US); Nathan Dirk Zelle, The Colony, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 142 days.

(21) Appl. No.: 09/909,541

(22) Filed: Jul. 20, 2001

(65) Prior Publication Data

US 2003/0018945 A1 Jan. 23, 2003

(51) Int. Cl.$^7$ ............................................. G06F 17/50
(52) U.S. Cl. ...................... 716/4; 716/5; 716/6
(58) Field of Search ............................ 716/4.5; 714/25, 714/33, 738, 739, 741, 744

(56) References Cited

U.S. PATENT DOCUMENTS

| | | | | |
|---|---|---|---|---|
| 5,729,554 A | * | 3/1998 | Weir et al. | 714/739 |
| 5,831,998 A | * | 11/1998 | Ozmizrak | 714/741 |
| 6,175,946 B1 | * | 1/2001 | Ly et al. | 716/4 |
| 6,347,388 B1 | * | 2/2002 | Hollander | 714/739 |
| 6,449,741 B1 | * | 9/2002 | Organ et al. | 714/724 |
| 6,457,152 B1 | * | 9/2002 | Paley et al. | 714/738 |
| 6,530,054 B2 | * | 3/2003 | Hollander | 714/739 |

OTHER PUBLICATIONS

York et al., "An Integrated Environment for HDL Verification", Jul. 1995, IEEE, p. 9–18.*
Miyake et al., "Automatic Test Generation for Functional Verification of Microprocessors", 1994, IEEE, p. 292–297.*
Zhang et al., "Functional Verification with Completely Self–Checking Tests", IEEE, p. 2–9, Apr. 1997.*
Biswas et al., "Functional Verification of the Superscalar SH–4 Microprocessor", IEEE, p. 115–120, Feb. 1997.*

* cited by examiner

Primary Examiner—Vuthe Siek
Assistant Examiner—Naum Levin

(57) ABSTRACT

A system and method for automatic verification of a test plan for a semiconductor device. The device is specified by a hardware description language (HDL) model or a formal description language model derived from the HDL model. A test plan tool and database are provided to capture test item definitions and identifications and a monitor generator is provided to generate monitors for detecting functional coverage during verification. An evaluator is provided to compare verification-events with test-plan items, to determine test item completeness and to update the test plan database.

28 Claims, 2 Drawing Sheets

SYSTEM AND METHOD FOR EVALUATING FUNCTIONAL COVERAGE LINKED TO A VERIFICATION TEST PLAN

FIELD OF THE INVENTION

This invention relates generally to semiconductor device verification, and more particularly to the automatic evaluation of semiconductor behavior within a framework defined by a test plan.

BACKGROUND OF THE INVENTION

Hardware logic design is preferably tested prior to manufacture. Functional verification, such as logic simulation, is a process used to demonstrate design correctness. In other words, functional verification is performed on a hardware description language (HDL) model prior to manufacturing to ensure that a design's implementation satisfies the requirements defined by its specification. Determining design verification completeness, however, is consistently one of the most difficult and challenging aspects of the hardware design verification process.

There are many facets of hardware behavior that are of interest to the verification process, including correct result generation, proper sequence of events and timing relationships between signals, as well as other design properties such as "reachability" and arbitration "fairness."

Verification Test plans. The verification test plan identifies the features of the design that are to be verified. Generally, features to be verified are interpreted and extracted from the design's specification or requirements document, as well as being described or enumerated by the engineer based on his knowledge of the design implementation. Each feature to be verified (i.e., test item) is labeled and added to the verification test plan along with a short description of exactly what is to be verified. To ensure functional verification completeness, a unique test (or test case) must be generated for each test plan item and applied to the design model.

Verification Levels. The verification process is generally partitioned into the following levels of granularity: block-level (sometimes referred to as unit-level verification), chip-level and system-level. Block-level verification offers the best simulation performance (i.e., takes less time to verify) while system-level verification offers the worst performance. In addition, block-level verification offers the most controllability and observability over all levels of verification. Hence, many features of the design are generally easier to verify at this lower level of the design. A drawback of block-level verification is that creating a test-bench, which is required to model the block-level environment (i.e., used to drive input stimulus into the block-level design and validate output responses), might become as complex as the actual design itself. This is the case if block-level interfaces are unstable (i.e., keep changing in an ad-hoc fashion during the design process). Accordingly, some features of the design, which require higher levels of integration, cannot be verified at the block-level.

Chip-level verification, while possessing reduced controllability and observability, offers ease in test-bench generation due to its stable interface as well as higher integration of block-level components. In addition, chip-level verification has a direct relationship to the physical design facilitating chip interface and manufacturing test pattern verification. Some features of the design, which require higher levels of integration, cannot be verified at the chip-level of design.

System-level verification provides the highest level of integration, thus eliminating the need to model environmental assumptions. Conceptually all features of a design could be verified at the system-level. In practice, however, this is not practical due to reduced controllability and observability and decreased simulation performance (e.g., decrease simulation cycles per second).

Simulation Verification Strategies. To be successful, verifying large complex designs requires multiple simulation-based verification strategies, such as: directed, random and transaction-based testing. Strategy selection is determined by the characteristics and goals of a specific test item, as defined in the verification test plan.

Directed test, which usually contains self-checking code, focuses the verification process on particular functional behavior of the design or increases verification coverage on a specific test item or area of concern. Although directed test generally provides high coverage for a specific feature to be verified (i.e., test item), developing a directed test is a labor-intensive process. It is difficult to determine what additional design functionality has been verified with directed testing, aside from the specific feature targeted by a particular directed test.

Random testing with self-checking code provides a mechanism for directing the verification process toward unforeseen behavior of the design, subtle interactions, or complex sequence of multiple simultaneous events without the labor-intensive effort of generating multiple directed tests. Determining exactly what functionality has been verified through random testing is generally a problem since there is no direct coverage metrics linked back to the verification test plan.

Transaction-based verification can be efficiently employed to prove communication-based correctness when integrating block or chip-level components. Many block-level design features, such as implementation details, can be difficult to verify using transaction-based verification. Hence, determining exactly what test plan functionality is covered, unrelated to the bus transactions, is a challenge.

Formal and Semi-Formal Verification Methodologies: So-called formal verification tools include state-space exploration, static property checker and model checker tools that validate user-specified properties using static and formal techniques without test vectors. Formal tools are heavily proof driven and mathematical in approach. Semi-formal verification tools, such as amplification tools, combine traditional simulation techniques with formal state-space exploration and model checking techniques. The mathematical proofs of the formal tool approach are employed with a limited or bounded search at certain times during the verification process.

Generally, specific features (test items) defined in the verification test plan are translated to formal description language properties and proved using formal techniques. During manual review, if the properties associated with a test item are proved valid using formal verification, then the test plan's test item is declared covered.

Completeness: Determining verification completeness, related to the design's test plan, is currently a manual and ad-hoc process. Generally, upon successful execution of the design's combined suite of tests (directed, random, etc.), the design team will declare that the functionality as defined in the test plan has been verified. Random simulation provides a mechanism for identifying design flaws, particularly related to unforeseen characteristics of the design or subtle interactions of complex sequences of events. Determining exactly what functionality related to the original test plan has been verified using random simulation has historically been a problem.

Existing verification methods do not directly link the verification process to the test plan in an automatic fashion. No automatic method is available by which the engineer can determine when all features of the design, as specified in the test plan, have been verified. A systematic and automatic method for evaluating test plan functional coverage is desirable and preferable to the current manual and ad-hoc evaluation process.

SUMMARY OF THE INVENTION

According to the present invention, a system and method are provided for automatic verification of a test plan for a device. The device is specified by a hardware description language (HDL) model or a formal description language model derived from the HDL model. A test plan tool and database are provided to capture test item definitions and identifications and a monitor generator is provided to generate monitors for detecting functional coverage during verification. An evaluator is provided to compare verification-events with test-plan items, to determine test item completeness and to update the test plan database.

By capturing test item events during the verification process, and evaluating the relation of these events to the original test plan test item definition, a user can automatically determine exactly what features are being verified using any or all verification strategies (e.g., directed, random as well as transaction-based simulation). Unlike other coverage techniques, which are not linked directly to the verification test plan, the method of the invention immediately facilitates determining functional verification completeness as specified by the verification test plan.

Therefore, in accordance with the method of the present invention, a method for automatically verifying the test plan of a software model of a semiconductor device includes generating monitors for characteristics of the software model that each correspond to a verification event in accordance with a test plan item stored in a test plan database, processing the software model and monitors in a modeling environment and generating verification events, and comparing the verification events and test plan items and updating the test plan database.

Further, in accordance the present invention, a system is provided for automatic verification of a test plan for a software model of a semiconductor device. The system comprises a test plan database for storing test plan items relating to the test plan, a monitor generator for generating monitors for characteristics of the software model, each monitor corresponding to a verification event according to one of the test plan items, a modeling environment for processing the software model and the monitors and generating verification events, and an evaluator for comparing the verification events and the test plan items and updating the test plan database.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
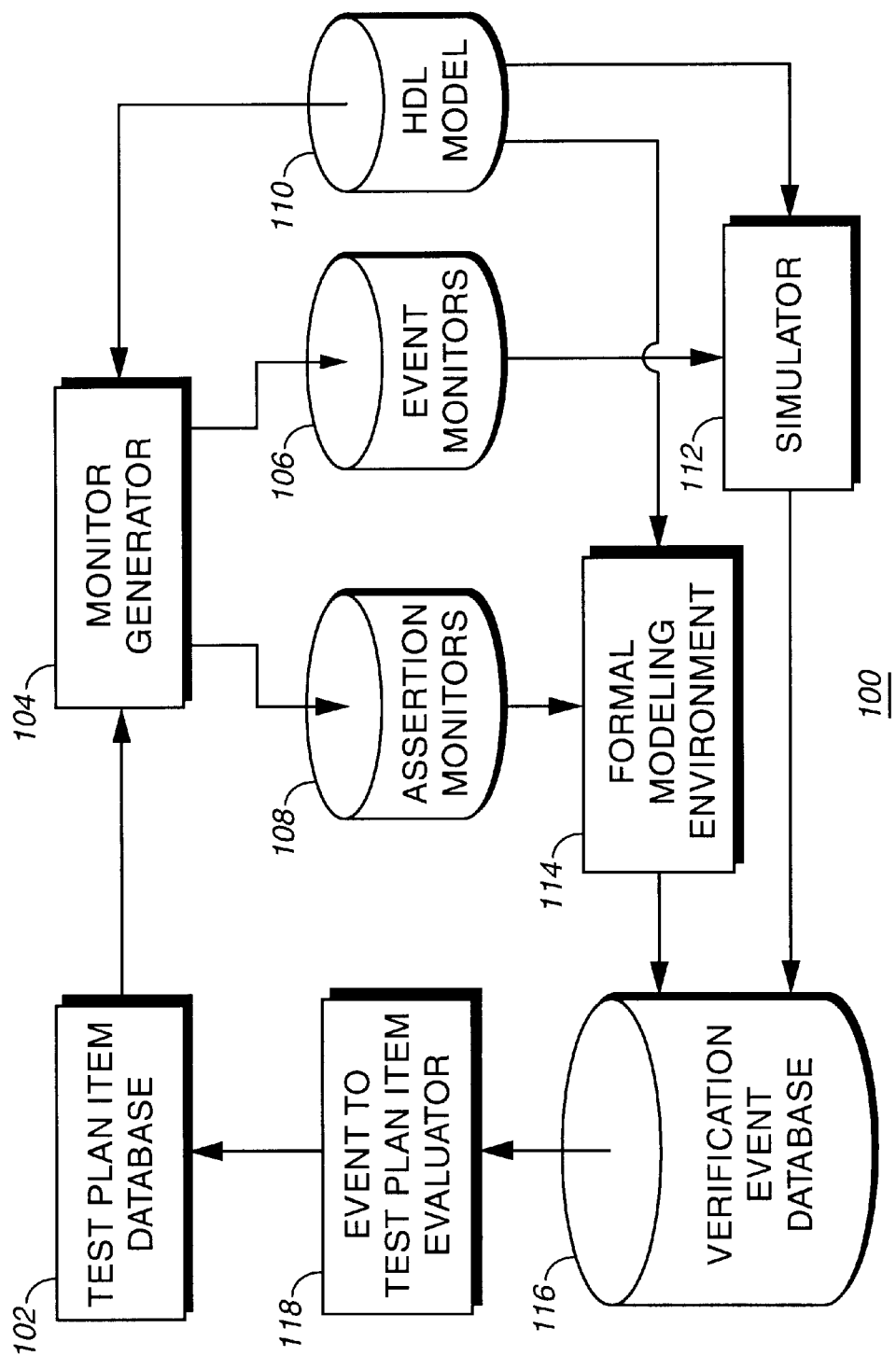
FIG. 1 is a block diagram of a system for automating the evaluation of test plan function coverage according to the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several Views of the drawings.

The present invention provides a system and method for automatic determination of functional verification completeness, as specified by a verification test plan. It further provides a system and method for automatic measurement of test plan functional coverage related to multiple simulation-based verification strategies, which may be applied across multiple verification levels (i.e., block, chip and system-level verification).

FIG. 1 is a block diagram of a system 100 for automating the evaluation of test plan function coverage according to the invention. In this embodiment, the system is implemented on a computer. Test plan tool and database 102 is used to capture test item definitions and identifications. The test plan tool and database is used by a designer to create a framework that defines the combination of the characteristics or functional behavior to be verified. Each feature is defined as a test item within the database. The designer may use the test plan tool to simplify the construction and maintenance of the test plan database.

A Testplan Tool may provide a graphical user interface (GUI), which is used to input data into a Testplan database. In one embodiment, the first step in using this tool is for the verification engineer to define a testplan item (i.e., a specific characteristic of the design he or she intends to verify). A characteristic may be a behavior of the design that is characterized by the occurrence of a specific event. The characteristic may be a property of the design characterized, for example, by a parameter or variable having a particular value or a value in a specified range. The Testplan Tool GUI permits the engineer to create a written description for each testplan item and to define a set of events related to each specific testplan item. An event is a set of Verilog (or VHDL) nets of signals, which are combined into an expression. For example:

event queue_full:: top.a1.q_ready & top.a2.q_full;

The 'queue_full' event is formed by performing a logical AND operation between the hierarchical Verilog signals top.a.1.q_ready and top.a2.q_full—thus creating an event expression. When this event expression becomes TRUE (I.e., a logical 1) during the verification process (e.g., simulation), then the queue_full event has occurred in the verification environment. Furthermore, a time of occurrence (e.g., simulation time) can be associated with the event for use in additional analysis.

In the preferred embodiment, the Testplan tool allows the verification engineer to compose complex events by combining simple event definitions into more complex equations. Furthermore, temporal (time) relationships of events can be formed. For example, if Event2 must occur three cycles after Event1, a new event can be defined as follows:

event Event3::{Event1, [2], Event3};

The syntax of the temporal language used to describe events may change without departing from the spirit and scope of the invention. It will be apparent to those skilled in the art that other temporal languages could be used.

In addition to gathering user input to build the Testplan database, the Testplan Tool can be used to query verification coverage statistics and status for a single or all Testplan Items. The Testplan tool can report which events have occurred during a single verification step—and indicate which events did not occur, thus preventing the event requirements for a given Testplan Item being satisfied.

The designer is not required to use a test plan tool to create the database, any form of input is acceptable. The database comprises a collection of test items (i.e., test cases), which consist of a text description of the feature being tested and a detailed list of HDL event definitions and labels. To satisfy a test item (i.e., verify this feature), a proper combination or sequence of HDL events must be detected during the verification process. Generally, multiple events are defined and associated with a test item.

In a further embodiment the database comprises a collection of test items (i.e., test cases), which consist of a text description of the characteristic being tested and a detailed list of model assertions and labels. To satisfy a test item (i.e., verify this feature), a proper combination of assertions must be proven during the verification process.

A design event may be defined as an HDL expression, which evaluates to a TRUE value. For example, if the expression (reset !=1 && q_overflow==1) evaluates TRUE, then an event has occurred in the verification environment. For this example, a queue overflow event has been detected.

In one embodiment, the test plan database includes at least one of the following five objects:
{EVENT_LABEL,
EVENT_EXPRESSION,
HIER_MAP( ),
SEQUENCE_RELATION,
STATUS
}.

The EVENT_LABEL is a unique string to identify and reference a specific event in the verification environment. For example, EVENT_OVERFLOW_1 could be an EVENT_LABEL.

The EVENT_EXPRESSION is the actual HDL expression that must evaluate TRUE at some point within the verification environment for functional verification completeness. (NOTE: in general, multiple events must occur for the test to be declared as satisfied and covered).

The HIER_MAP( ) is any type of mapping function which maps the test item EVENT to a unique location within the hierarchical HDL model.

The SEQUENCE_RELATION object can be used to define a specific ordering or relationship of events. For example, EVENT_1 must occur before EVENT_2. Another example might be, EVENT_3 must occur precisely at 3 clocks after EVENT_4. The actual syntax and semantics of the language used for the SEQUENCE_RELATION can vary between implementations.

The STATUS object is used to keep track of events, as they are satisfied during the course of verification. Initially, this object declares the test item EVENT as unsatisfied.

Actual implementation details of the test plan database can vary. Other formats for the test plan database will be understood to those skilled in art without departing from the spirit and scope of the invention.

Referring again to FIG. 1, monitor generator 104 generates event-monitors 106 for each test item event-expression and maps event-expression and label (defined in the test plan database) to a point within the HDL code 110. Using the hierarchical mapping function, HIER_MAP( ), this component will generate an event-monitor within the HDL code to detect and report the occurrence of an event during the verification process. For example, if the test item defined an event (reset !=1 && q_overflow==1) in the test plan database with an event label EVENT_OVERFLOW_1, then the generator would create an event-monitor within the HDL code (in this example Verilog) as follows:
  event_monitor event_overflow_1 (reset !=1 && q_overflow==1);

The hierarchical map will determine at what precise place or places to instantiate the event_monitor within the HDL code. In this example, once this Verilog expression (reset !=1 && q_overflow==1) evaluates TRUE, the event_monitor will log the event label identifier, hierarchical path and event occurrence time in verification event database 116. The required behavior of this event-monitor is to (a) detect that an event has occurred in the HDL, (b) report the event label related to the original test item definition, event hierarchical path, and the event time (or reachable cycle) of occurrence.

In one embodiment, the event monitor mechanism instruments the Verilog code with Programming Language Interface (PLI) routines, which are used to monitor the event expressions defined in the testplan database. When the event expression evaluates TRUE (i.e., a logic 1), the PLI routine will log the event name (identifier), the event hierarchical expressions, and the verification point (e.g., simulation time) in which the event occurred. This logged data is analyzed by the verification-event-to-testplan-item evaluator component.

In this embodiment, the HDL code 110, together with the generated event-monitors 106, are processed by simulator 112. The simulator provides a model of how the device with respond to selected input (test) vectors. The simulator utilizes directed, random or transaction-based simulation strategies or a combination thereof. When a verification event occurs, the simulator 112 records the event in verification-event database 116.

The verification-event-to-test plan-item evaluator 118 is responsible for reading the test plan database and determining if the proper combination or sequence (time or order relationship) of events has occurred during the verification process (by component 112). A test item event definition is satisfied once the proper combination and sequence of events occurs. The test plan database 102 is automatically updated to indicate all satisfied test item events. The test plan tool can be queried to determine the overall completeness of the verification effort (e.g., simulation and/or model checking).

In a further embodiment, the monitor generator 104 also translates test items in the verification test plan into formal description language assertion-monitors, such as model check properties. In the embodiment shown in FIG. 1, assertion-monitors 108 are generated and used in formal model environment 114. If an assertion associated with a test item is proved to be valid, the verification event database 116 is updated accordingly.

It will be understood by those skilled in the art how the system shown in FIG. 1 may be modified to incorporate one or more of a number of verification tools.

Figure 2:
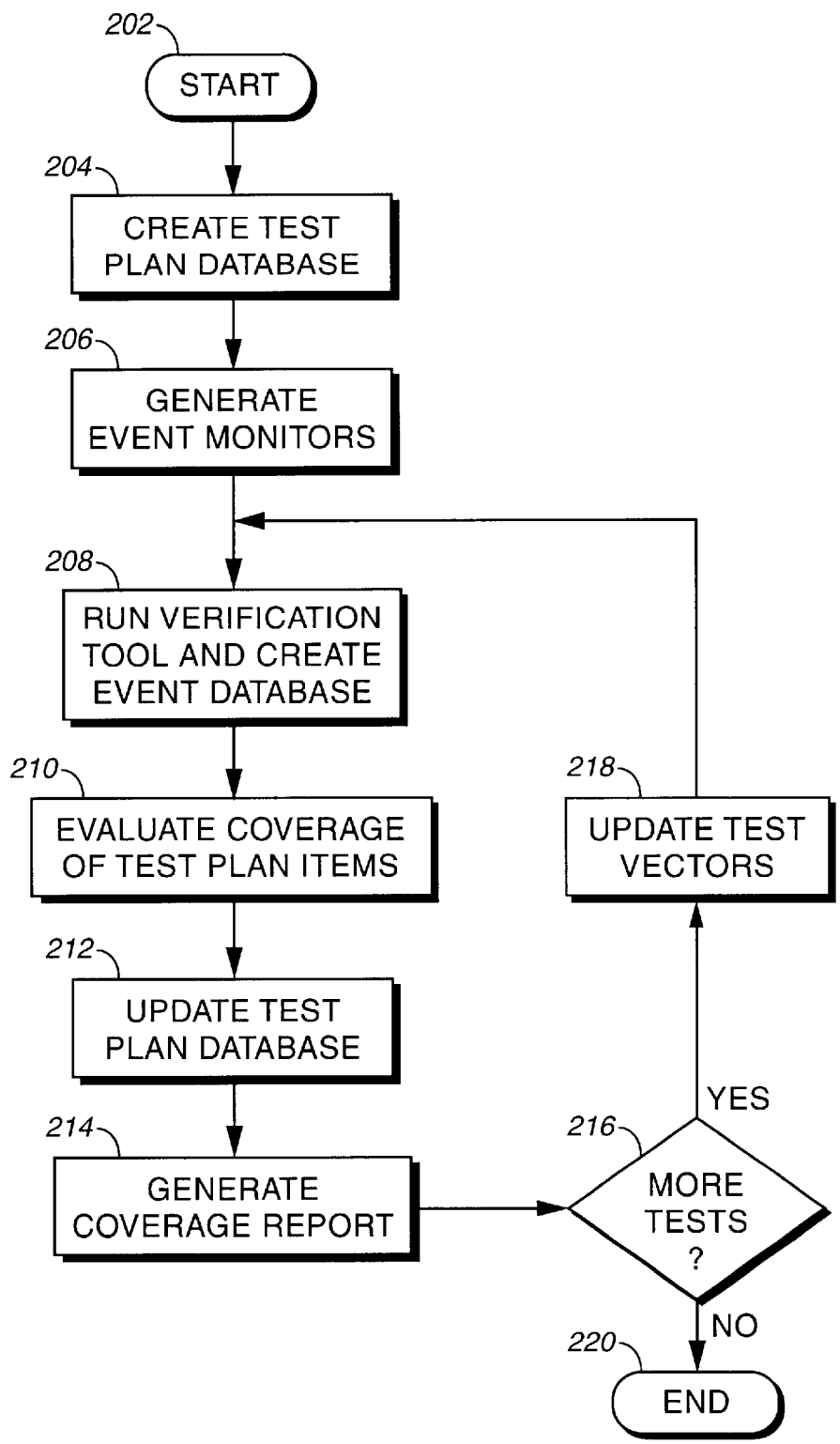
FIG. 2 is an overall flow of the methodology of the present invention according to one embodiment.

FIG. 2 illustrates the overall flow 200 of the method for evaluating functional coverage linked to a verification test plan according to one embodiment of the current invention. The first step after start block 202 is the generation at block 204 of a database of test plan items. Preferably, the designer uses a test plan tool to create a framework that defines the combination of features or functional behavior that must be verified. Each feature is defined as a test item within the database. The test plan tool is used to simplify the construction and maintenance of the test plan database, but it is not essential. At block 206, HDL event-monitors are generated. This step is performed automatically using information from the test plan database. In an alternative embodiment, assertion-monitors are generated for use in a formal model environment. In a still further embodiment, both event-monitors and assertion-monitors are generated. At block 208, a simulation of the device is performed. The simulation uses the HDL model of the device together with the HDL event-monitors generated at block 206. The simulation may use directed, random or transaction-based strategies, for example. While a simulation is performed in this embodiment, other verification tools, including formal and semi-formal tools, may be used either as an alternative to simulation or as an adjunct. The simulation creates or updates an event database of verification events that occur. At block 210, the test plan database is evaluated with respect to the event database to determine if all test items have been completed successfully. The test plan database is updated at block 212 to show which test items have been completed and a report is generated at block 214.

At decision block 216 a decision is made, based on this report, whether or not more tests are required. If more tests are required, as depicted by the positive branch from decision block 216, the simulation test vectors are updated at block 218, so as to increase coverage, and the simulation is run again. If no more tests are required, as depicted by the negative branch from decision block 216, the process ends at block 220.

The current invention provides a system and method for automatic measurement and tuning of functional coverage in a random simulation environment and automatic determination of the effectiveness of a directed or transaction-based test. It also provides a system and method for automatic evaluation of test plan coverage related to formal and semi-formal verification methodologies and for automatic capture of test items independent of the verification environments.

While the invention has been particularly shown and described with reference to a preferred embodiment, it will be understood by those skilled in the art that various changes in form and detail may be made therein without departing from the spirit and scope of the invention.

What is claimed is:

1. A system for automatic verification of a test plan for a software model of a semiconductor device, said system comprising:
    a test plan database for storing test plan items relating to said test plan, wherein a test plan item comprises an event expression object and a status object;
    a monitor generator for generating monitors for characteristics of said software model, each monitor corresponding to a verification event according to one of said test plan items;
    a modeling environment for processing said software model and said monitors and generating verification events; and
    an evaluator for comparing said verification events and said test plan items and updating said test plan database.

2. A system as in claim 1, further comprising:
    a verification event database for storing a log of said verification events,
wherein said evaluator updates said test plan database in accordance with said log of said verification events.

3. A system as in claim 1, wherein said software model is a hardware description language (HDL) model.

4. A system as in claim 3, wherein said characteristics of said software model are events and said monitors are HDL event monitors.

5. A system as in claim 4, wherein said modeling environment is a simulator.

6. A system as in claim 5, wherein said simulator uses at least one of a directed strategy, a random strategy and a transaction-based strategy.

7. A system as in claim 1, wherein said software model is a formal description language model.

8. A system as in claim 7, wherein said characteristics of said software model are model properties and said monitors are assertion monitors.

9. A system as in claim 7, wherein said modeling environment is a formal modeling environment.

10. A system as in claim 9, wherein said formal modeling environment uses at least one of a state-space exploration technique, a static property checker and model checker.

11. A system as in claim 7, wherein said modeling environment is a semi-formal modeling environment.

12. A system as in claim 1, wherein one or more of said test plan items comprises an event label, an event expression, a hierarchy map function, a sequence relationship and a status.

13. A system as in claim 1, wherein said monitor generator, said modeling environment and said evaluator are implemented as a computer program operating on a computer.

14. A method for automatic verification of a test plan for a software model of a semiconductor device, said method comprising:
    generating monitors for characteristics of said software model, each monitor corresponding to a verification event according to one of a plurality of test plan items stored in a test plan database, wherein a test plan item of the plurality of the test plan items comprises an event expression object and a status object;
    processing said software model and said monitors in a modeling environment and generating verification events; and
    comparing said verification events and said plurality of test plan items and updating said test plan database accordingly.

15. A method as in claim 14 and further comprising:
    determining test plan coverage;
    updating said modeling environment according to said test plan coverage; and
    re-processing said software model and said monitors in said modeling environment when said test plan coverage is determined to be insufficient.

16. A method as in claim 14, wherein said software model is a hardware description language (HDL) model.

17. A method as in claim 16, wherein said characteristics of said software model are events and said monitors are HDL event monitors.

18. A method as in claim 17, wherein said processing comprises a simulation.

19. A method as in claim 18, wherein said simulation uses at least one of a directed strategy, a random strategy and a transaction-based strategy.

20. A method as in claim 14, wherein said software model is a formal description language model.

21. A method as in claim 20, wherein said characteristics of said software model are model properties and said monitors are assertion monitors.

22. A method as in claim 20, wherein said processing is performed using a formal verification tool.

23. A method as in claim 22, wherein said formal verification tool uses at least one of a state-space exploration technique, a static property checker and model checker.

24. A method as in claim 20, wherein said processing is performed using a semi-formal verification tool.

25. A method as in claim 14, wherein at least one of said test plan items includes at least one of an event label, an event expression, a hierarchy map function, a sequence relationship and a status.

26. A method as in claim 14, wherein said generating, said processing, said comparing and said updating are implemented as a computer program running on a computer.

27. A method as in claim 14, wherein said verification events are stored in a verification-event database.

28. A method as in claim 14, wherein said generating monitors for properties of said software model is performed automatically.

* * * * *